United States Patent [19]
Arai et al.

[11] Patent Number: 5,348,589
[45] Date of Patent: Sep. 20, 1994

[54] SOLAR CELL AND METHOD OF FORMING THE SAME

[75] Inventors: Yasuyuki Arai; Setsuo Nakajima, both of Kanagawa, Japan

[73] Assignee: Semiconductor Energy Laboratory Co., Ltd., Kanagawa-ken, 243, Japan

[21] Appl. No.: 996,399

[22] Filed: Dec. 23, 1992

[30] Foreign Application Priority Data

Dec. 27, 1991 [JP] Japan .................. 3-360116

[51] Int. Cl.$^5$ ................ H01L 31/05; H01L 31/20
[52] U.S. Cl. ........................ 136/244; 437/2; 437/4; 437/51; 437/173; 437/205; 136/258
[58] Field of Search ............ 136/244; 437/2–5, 437/51, 173, 205

[56] References Cited

U.S. PATENT DOCUMENTS

4,518,815  5/1985  Yamazaki ............... 136/244
4,697,041  9/1987  Okaniwa et al. ........ 136/244

FOREIGN PATENT DOCUMENTS

3-151673  6/1991  Japan .................. 136/244

*Primary Examiner*—Aaron Weisstuch
*Attorney, Agent, or Firm*—Sixbey, Friedman, Leedom & Ferguson

[57] ABSTRACT

A manufacturing method and an improved structure for solar cells are described. A transparent conductive film and a photoelectric conversion layer are laminated on a flexible transparent substrate, and thereafter the laminate is divided by a first groove formed by laser scribing. A second groove is also formed at the same time in parallel to the first groove. The first groove is filled with an insulating material. An insulating strip is formed in parallel with the first groove. A reflective conductive film is then coated over the structure in order to make electric contact with the transparent conductive film. Finally, the reflective conductive film is divided by a third groove formed along the insulating strip.

26 Claims, 5 Drawing Sheets

SOLAR CELL AND METHOD OF FORMING THE SAME

BACKGROUND OF THE INVENTION

1. Field of the Invention

The present invention relates in general to a photovoltaic cell and a method of forming the same. More particularly, it relates to such a technology suitable for forming a flexible thin film photovoltaic cell.

2. Description of the Prior Art

Amorphous silicon thin film solar cells have been known as economical solar cells which can be formed on a large area of a glass substrate with a semiconductor laminate film having a thickness as thin as one micron or less. Particularly, when processed in accordance with the laser scribing technique, wide panels of this kind of solar cell can be easily produced with a high productivity.

Thin film solar cells have generally been fabricated by thin film semiconductors formed by vapor phase reactions, evaporation, sputtering, and so forth. Amorphous silicon semiconductors can be deposited on flexible substrates such as plastic films as well as glass substrates. Solar cells formed on such a flexible substrate also possess flexibility so that they can be provided on curved surfaces. Since typical flexible substrates are lightweight, the weight of a solar cell can be substantially reduced. Accordingly, the applicability of the amorphous thin film solar cell is greatly extended.

Figure 1A:
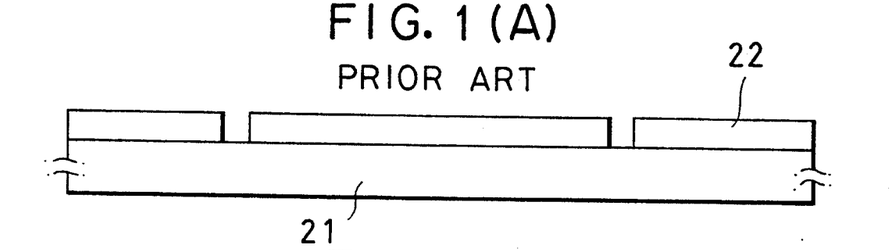
FIGS. 1(A) to 1(E) are cross sectional views showing a method of manufacturing a thin film solar cell in accordance with a prior art technique.
Figure 1B:
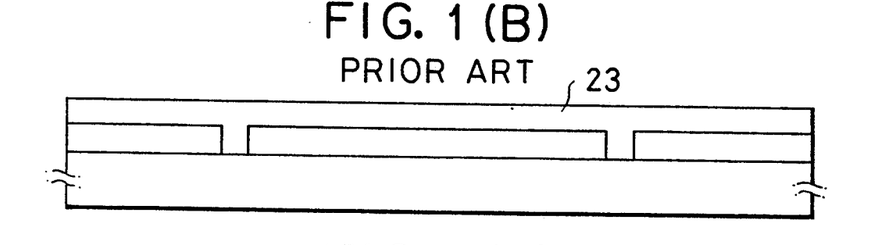
Figure 1C:
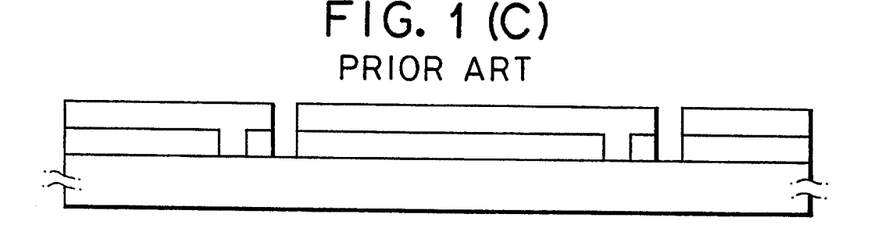
Figure 1D:
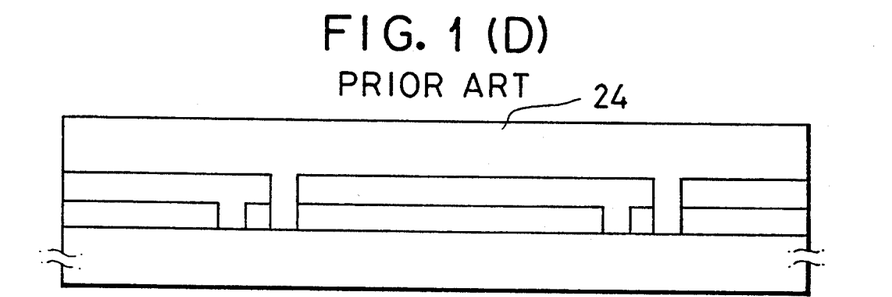
Figure 1E:
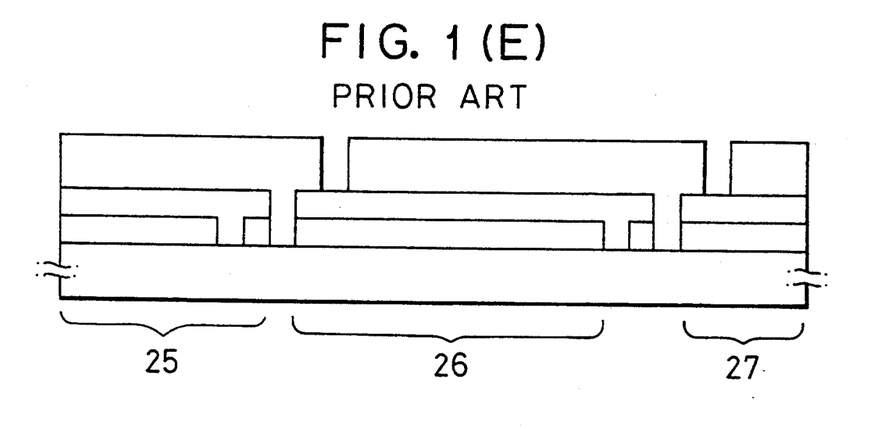

FIGS. 1(A) to 1(E) are cross sectional views showing a conventional method of forming thin film solar cells. A transparent conductive thin film 22 made of SnO$_2$; ITO, or the like is formed on a glass substrate 21 and patterned by laser scribing to divide the film 22 into a plurality of transparent conductive electrodes as illustrated in FIG. 1(A). An amorphous silicon semiconductor photoelectric conversion layer 23 is formed on the substrate 1 over the transparent conductive electrodes as illustrated in FIG. 1(B). A PIN semiconductor junction is formed within the photoelectric conversion layer 23 for photoelectric conversion. The photoelectric conversion layer 23 is then divided into a plurality of photoelectric conversion regions by laser scribing corresponding to the underlying transparent conductive electrodes as illustrated in FIG. 1(C). The entire structure is coated with a metallic film 24 made of aluminum or chromium which provides a reflective rear surface as illustrated in FIG. 1(D). In the case of a see-through type (transmission type), the reflective metallic film is replaced by a transparent conductive film. The metallic film 24 is then divided into a plurality of rear electrodes by laser scribing corresponding to the underlying photoelectric conversion regions and the transparent conductive electrodes as illustrated in FIG. 1(E) in order to provide a series connection of photoelectric conversion units each consisting of the conductive transparent electrode, the photoelectric conversion region, and the rear electrode. It has been also proposed to form flexible solar cells by laser scribing on flexible substrates utilized in place of the glass substrate in the above method. The term "solar cell" is used to designate a general photoelectric conversion device consisting of a plurality of the photoelectric conversion units connected in series, each of which is a minimum construction capable of generating electric energy converted from optical energy.

There are, however, two serious problems associated with the above conventional technique which make it difficult to form highly integrated solar cells by the use of the laser scribing technique. One of these problems is a general problem which occurs irrespective of the kind of the substrate. Namely, the problem occurs when the rear conductive film 24 is divided into the plurality of the rear electrodes by laser scribing. If the output power of the laser is limited in order not to damage the underlying semiconductor layer 23, the rear electrodes are often electrically shorted since the scribing may have been incomplete to sever the conductive film 24 into separate rear electrodes. On the contrary, if the output power of the laser is sufficiently high in order to ensure the division of the conductive film 24, the underlying semiconductor layer 23 is removed or damaged at the same time so that the yield of the solar cells is substantially decreased.

The other problem occurs when a flexible film is utilized as the substrate in place of the glass substrate. The method as shown in FIGS. 1(A) to 1(E) can be basically utilized on a flexible substrate such as a plastic sheet in the same manner. The process, however, must be carried out at such low temperatures as not to damage the flexible film. Several types of plastics for industrial usage and organic resins have been well known in the art. The heat resisting properties of such flexible substrates are very poor and in general they are deteriorated at temperatures no lower than 100°.

Figure 2:
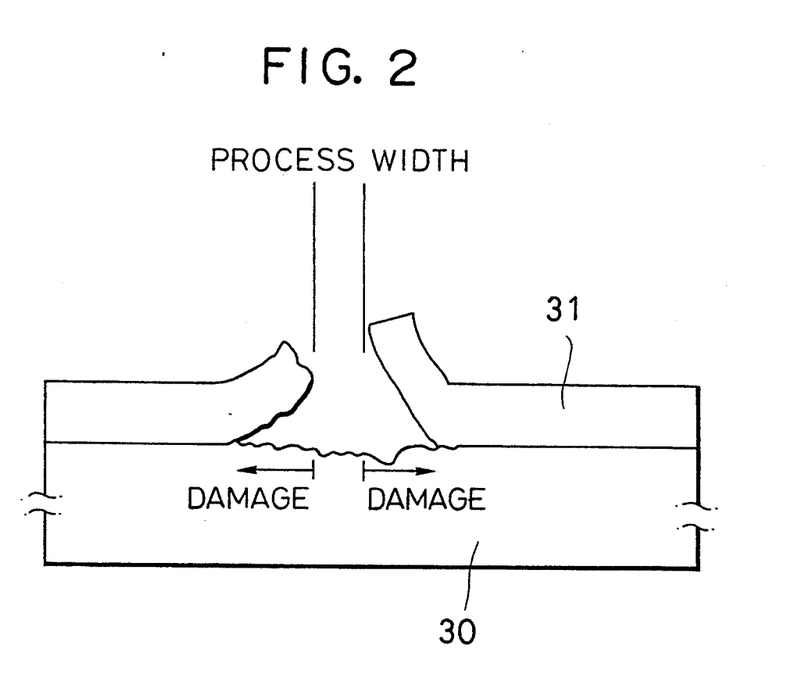
FIG. 2 shows a substrate of a solar cell damaged during the manufacturing process in accordance with the prior art technique.

The transparent conductive film 22 is severed by laser scribing also when the substrate 21 is made of a flexible film. Since the transparent conductive film must be completely separated, the flexible substrate 21 is necessarily exposed to laser light and therefore damaged at the resulting high temperatures. FIG. 2 schematically illustrates the damaged portion of the flexible substrate 21. The damage due to the high temperature tends to be spread around the exposed area and causes the overlying transparent conductive film 22 to lift off from the flexible substrate as illustrated in FIG. 2. The conductive film which is lifted off often forms separate flakes. The sizes of the damaged areas and the flakes easily reach several micrometers while the thickness of the photoelectric conversion layer is no thicker than 1 micrometer. As a result, a short current path is formed which bridges the transparent conductive electrode and the metallic electrode at a high probability. This is inevitable since there has been found no flexible material suitable for use in manufacture of solar cells and having a high heat resistance. Of course, although not so significant, the above problem is also the case when flexible films other than plastic films are utilized as the substrate and when a glass substrate is utilized as the substrate.

BRIEF SUMMARY OF THE INVENTION

It is an object of the present invention to provide a photovoltaic cell with a high reliability.

It is another object of the present invention to provide a flexible photovoltaic cell.

It is a further object of the present invention to provide a photovoltaic cell suitable for mass production.

It is a still further object of the present invention to provide a method of forming a photovoltaic cell with a high reliability.

It is a still further object of the present invention to provide a method of forming a photovoltaic cell on a flexible substrate.

Additional objects, advantages and novel features of the present invention will be set forth in the description which follows, and in part will become apparent to those skilled in the art upon examination of the following or may be learned by practice of the present invention. The objects and advantages of the invention may be realized and attained by means of the instrumentalities and combinations particularly pointed out in the appended claims.

To achieve the foregoing and other objects and in accordance with the present invention, as embodied and broadly described herein, a photovoltaic cell is manufactured by the steps of forming a first conductive film on a substrate; forming a photoelectric conversion layer on the first conductive film; forming a first groove through the photoelectric conversion layer and the first conductive film in order to electrically divide the first conductive film; forming an opening through the photoelectric conversion layer and reaching to the first conductive film; forming a first insulating strip to fill the first groove; forming a second conductive film on the photoelectric conversion layer over the first strip in electrical contact with the first conductive film through the opening; and forming a second groove through the second conductive film in order to electrically divide the second conductive film, the opening being located between the first groove and the second groove.

The photovoltaic cell as formed above includes two photoelectric conversion units each comprising a first electrode divided from a first conductive film, a photoelectric conversion region divided from the photoelectric conversion layer, and a second electrode divided from the second conductive film. The two photoelectric conversion units are coupled in series by electrical connection of the first electrode of one of the units and the second electrode of the other. Of course, in many cases, there are formed a larger number of such photoelectric conversion in series in the same manner. That is, a photovoltaic cell according to the present invention comprises a plurality of series connected photoelectric conversion units, each of which comprises a pair of electrodes and a photoelectric conversion layer provided between said electrodes; and an insulator provided in each unit for insulating said pair of electrodes from one another. The insulator is provided in the groove formed in one of said pair of electrodes and comprises a material selected from the group consisting of silicon oxide and organic resin.

Since the first groove is formed through both the first conductive film and the photoelectric conversion layer, it is unlikely to cause lifting off of the first conductive film during formation of the first groove even if the substrate has a poor resistance to high temperatures. This is because the first conductive film is covered or in fact protected by the photoelectric conversion layer.

In accordance with another aspect of the present invention, a photovoltaic cell is manufactured by the steps of forming a first conductive film on a substrate; forming a photoelectric conversion layer on the first conductive film; forming a first groove extending through the first conductive film and the photoelectric conversion layer in order to electrically divide the first conductive film and the photoelectric conversion layer; forming an insulating strip on the photoelectric conversion layer and extending substantially in parallel to the first groove; forming an opening through the photoelectric conversion layer between the first groove and the insulating strip and reaching to the first conductive film; forming a second conductive film on the photoelectric conversion layer over the insulating strip in electrical contact with the first conductive film through the opening; and forming a second groove through the second conductive film along and reaching to the insulating strip in order to electrically divide the second conductive film.

The photovoltaic cell as above formed includes two photoelectric conversion units, each comprising a first electrode divided from the first conductive film, a photoelectric conversion region divided from the photoelectric conversion layer, and a second electrode divided from the second conductive film. The second electrodes of the two photoelectric conversion units are separated by the second groove with the insulating strip between the photoelectric conversion layer and the second conductive film. The two photoelectric conversion units are coupled in series by electrical connection of the first electrode of one of the units and the second electrode of the other. Of course, in many cases, there are formed a larger number of such photoelectric conversion units in series in the same manner.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 3A:
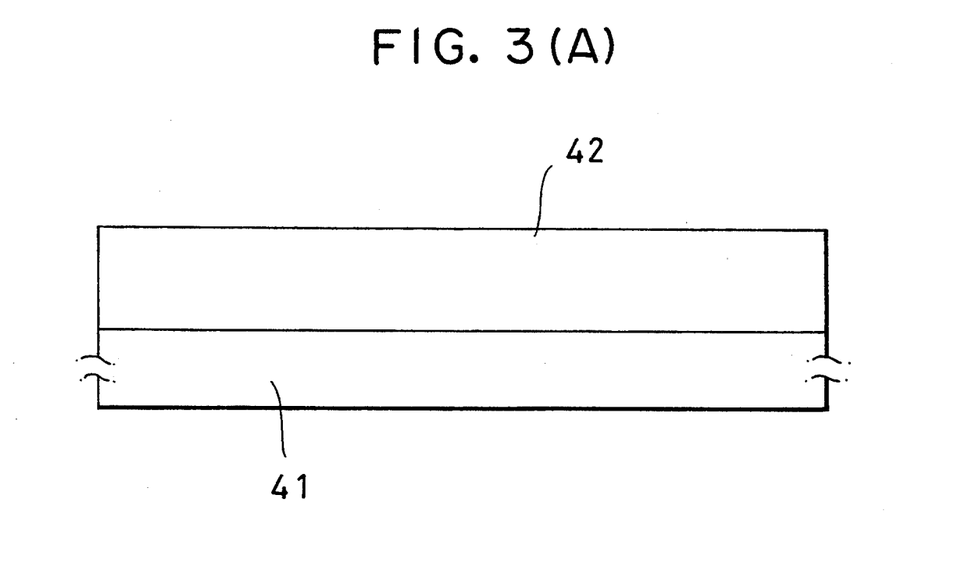
FIGS. 3(A) to 3(F) are cross sectional views showing a method of manufacturing a thin film photovoltaic cell in accordance with an embodiment of the present invention.
Figure 3B:
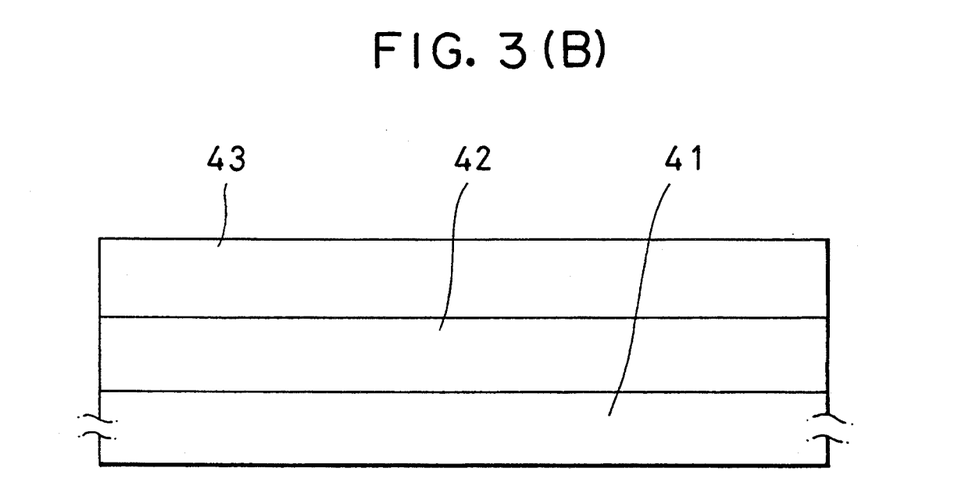
Figure 3C:
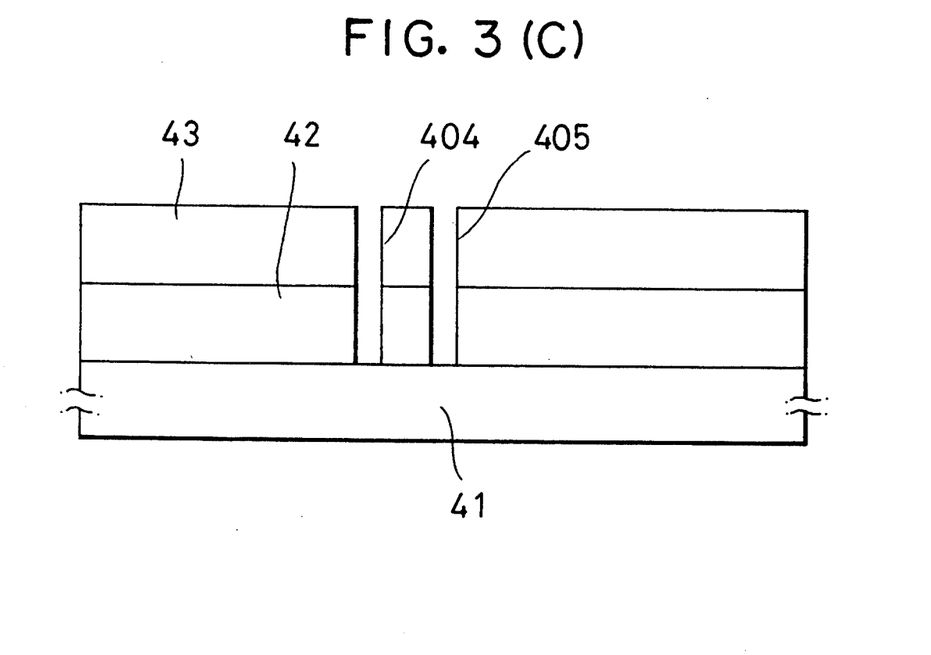
Figure 3D:
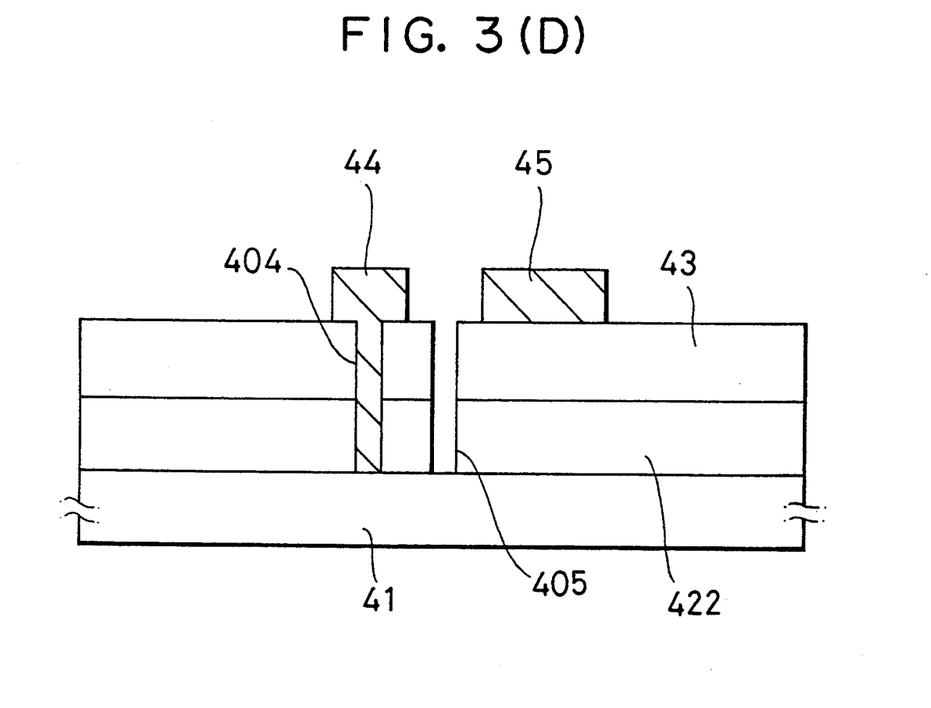
Figure 3E:
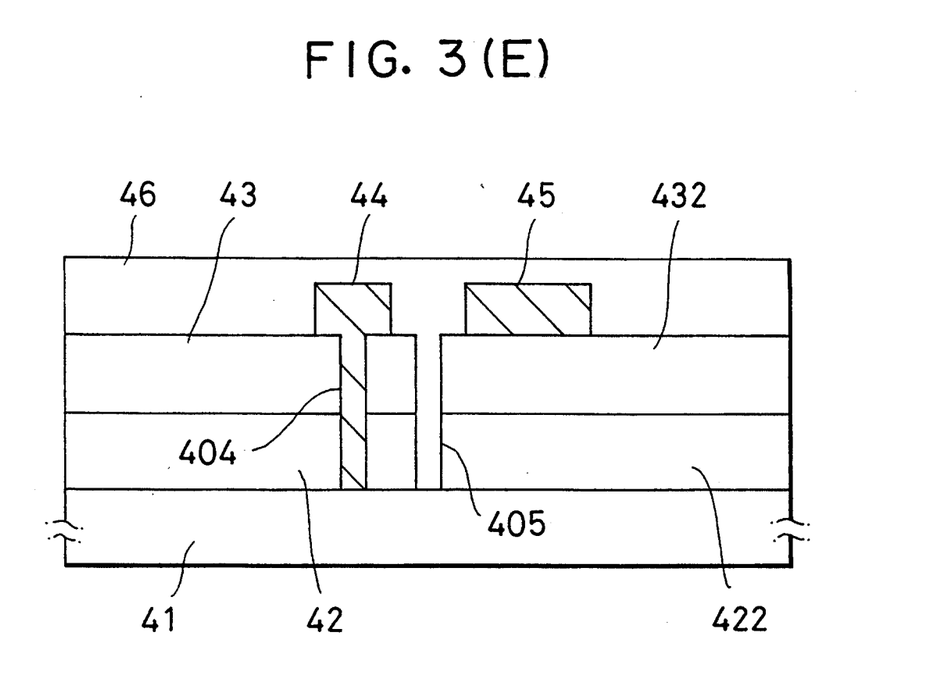
Figure 3F:
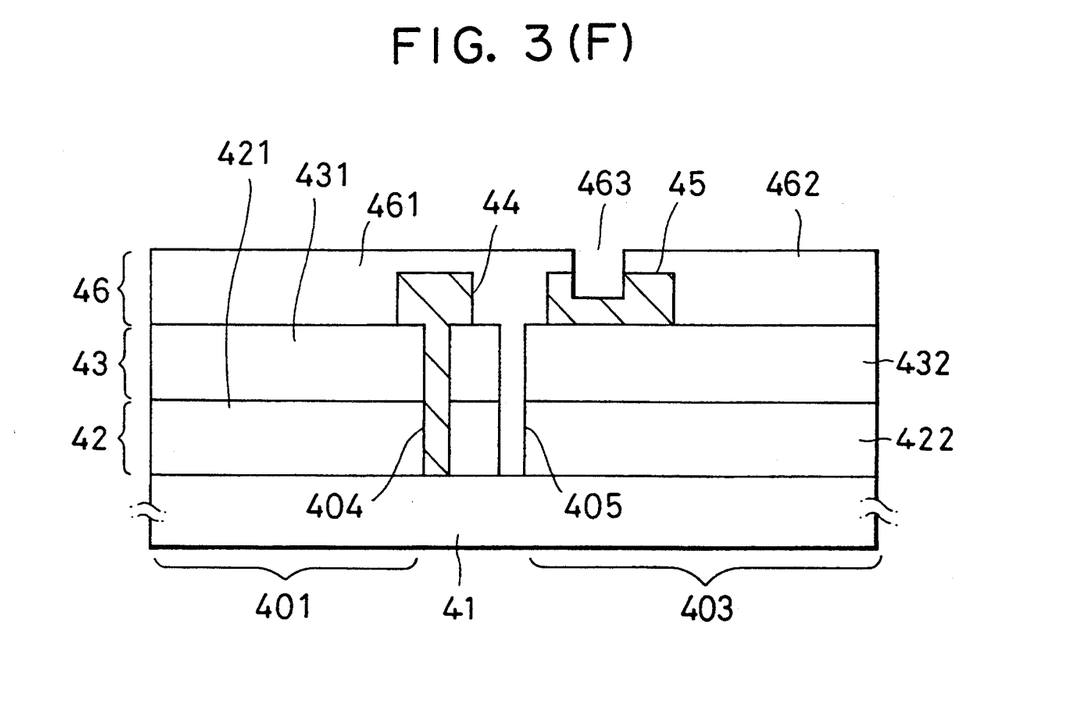

Referring now to FIGS. 3(A) and 3(F), a method of manufacturing a thin film photovoltaic cell in accordance with a preferred embodiment of the present invention will be explained.

A polyethylene terephthalate film is used as an insulating transparent flexible substrate 41. A transparent conductive file 42 made of indium tin oxide is deposited on the substrate 41 to a thickness of 4000 angstroms by DC magnetron sputtering, as illustrated in FIG. 3(A). The deposition conditions in the DC magnetron sputtering apparatus are as follows:

| | |
|---|---|
| Argon partial pressure: | $6 \times 10^{-3}$ Torr |
| Oxygen partial pressure: | $6 \times 10^{-4}$ Torr |
| DC current: | 1 A |
| Substrate temperature: | room temperature |

A photoelectric conversion layer 43 is then deposited to a thickness of 4500 angstroms on the transparent conductive film 42 by plasma CVD, as illustrated in FIG. 3(B). The layer 43 is composed of a p-type amorphous semiconductor film, an amorphous intrinsic semiconductor file, and an n-type amorphous semiconductor film deposited in this order and forming a PIN junction.

Of course, these semiconductor films can be laminated twice to form a PINPIN junction if desired. The p-type amorphous semiconductor film is deposited to a thickness of 100 angstroms under the following conditions:

| | |
|---|---|
| Substrate temperature: | 80° C. |
| RF power: | 10 W(13.56 MHz) |
| Pressure in the deposition chamber: | 0.04 Torr |
| Gas flow rate: | $SiH_4 + B_2H_6 = 16$ sccm |
| | $CH_4 = 18$ sccm |
| | $H_2 = 145$ sccm |

$B_2H_6$ is a dopant gas introduced into $SiH_4$ at a ratio of $B_2H_6/SiH_4=0.01$ during the above conditions. The amorphous intrinsic semiconductor film is deposited to a thickness of 4000 angstroms under the following conditions:

| | |
|---|---|
| Substrate temperature: | 80° C. |
| RF power: | 10 W(13.56 MHz) |
| Pressure in the deposition chamber: | 0.04 Torr |
| Gas flow rate: | $SiH_4 = 15$ sccm |
| | $H_2 = 150$ sccm |

The n-type amorphous semiconductor film is deposited to a thickness of 400 angstroms under the following conditions. $PH_3$ is a dopant gas introduced into $SiH_4$ at a ratio of $PH_3/SiH_4=0.01$.

| | |
|---|---|
| Substrate temperature: | 80° C. |
| RF power: | 10 W(13.56 MHz) |
| Pressure in the deposition chamber: | 0.04 Torr |
| Gas flow rate: | $SiH4 + PH_3 = 15$ sccm |
| | $H_2 = 150$ sccm |

The transparent conductive film 42 and the photoelectric conversion layer 43 are separated into three portions by laser scribing. Namely, first and second grooves 404 and 405 are formed by partially removing the transparent conductive film 42 and the photoelectric conversion layer 43 by projecting laser pulses thereunto from a KrF excimer laser, as illustrated in FIG. 3(C). The first and second grooves 404 and 405 preferably have a width of 10 to 40 μm. The wavelength of laser pulses emitted from the excimer laser is 248 nanometers. The laser pulses consist of flat laser light having a linear cross section corresponding to the grooves so that the transparent conductive film 42 and the photoelectric conversion layer 43 are processed along the entire length of the grooves 404 and 405 at the same time by each laser pulse. Alternatively, the laser pulses may consist of laser light having a circular cross section so that the formation or the first and second grooves can be accomplished by repeating the projection of the laser pulse along the grooves. Of course, other lasers such as ArF excimer lasers, XeF excimer lasers, and YAG lasers can be employed depending upon the case, in place of the KrF excimer laser. Preferably, the wavelength of the laser light is no longer than 600 nanometers. It is, however, possible to use a YAG laser, which emits spot laser light having a wavelength of 1.06 micrometers.

As seen from FIG. 3(C), the first groove 404 is formed in order electrically separate the transparent conductive film 42 to form a first transparent electrode 421 and a second transparent electrode 422 and in order to separate the photoelectric conversion layer 43 to form a first photoelectric conversion region 431 on the first transparent electrode 421 and a second photoelectric region 432 on the second transparent electrode 422. The second groove 405, however, need not be formed to completely separate the transparent conductive film 42 because it is provided only to access the right hand portion 422 of the transparent conductive film 42 as discussed in the following. For this reason, the first groove 404 is formed by projecting a laser pulse at 1.0 J/cm² for 7 times whereas the second groove 405 is formed by projecting a laser pulse at 1.0 J/cm² for 4 times. Of course, the first and second grooves 404 and 405 can be formed under the same conditions.

It is noted in this laser scribing process that the transparent conductive film 42 is overlaid by the photoelectric conversion layer 43 so that the transparent conductive file 42 does not lift off from the substrate 41 due to the energy of the laser pulse. Accordingly, the various problems explained above with reference to FIG. 2 are not caused in accordance with the present invention. The inventors have confirmed the advantages of the invention by experiments, i.e. that the lifting off of the transparent conductive film, generation of conductive flakes, and formation of splits were effectively prevented as compared with the conventional case of laser scribing performed on a single layer of the transparent conductive film. This is also the case when other flexible substrates are used in place of the plastic substrate 42.

Next, first and second insulating patterns or strips 44 and 45 of an epoxy resin are formed at the same time on the structure by screen press printing in parallel to the first and second grooves 404 and 405 as illustrated in FIG. 3(D). The first strip 44 is formed in order to completely fill the first groove 404. The second strip 45 has a width of 40 to 500 μm. The second strip 45 is formed on the second photoelectric conversion region 432 to extend along the second groove 405 in order that said second groove 405 is located between the first groove 404 and the second strip 45. In this case, the patterning process can be carried out at once by screen press printing so that formation of defects is unlikely as compared with the cases utilizing other processes such as laser scribing, etching, etc. Accordingly, the yield is substantially improved by this process. Of course, other insulating materials, e.g. resists, silicon oxide, urethane, acrylic, or other organic resins such as polyamide, silicon rubbers, etc. can be employed. The second strip 45, however, is exposed to laser pulses in the later procedure so that the insulating material preferably has a certain resistance to high temperatures in order that the second strip 45 is not easily separated or completely removed by sublimation due to the laser energy. Also, it should be avoided that the insulating material is so transparent as to pass incident laser pulses therethrough to the underlying surface.

Next, the structure is coated with a conductive film 46 of 3000 angstroms thickness as illustrated in FIG. 3(E). The conductive film 46 is formed by vacuum evaporation of aluminum on the photoelectric conversion layer over the first insulating strip 44 and the second insulating strip 45 in order to fill the second groove 405. The aluminum film 46 provides a reflective inner surface in the structure. Of course, other conductive materials can be used in place of aluminum. Among from such conductive materials are Ag, Cr, Ni, Mo, SUS (stainless steel), or transparent conductive materials such as indium tin oxide or $SnO_2$. If a transparent conductive material is used, the solar cell can partly pass light therethrough. These conductive materials can be formed on the structure by any suitable method as long as the process temperature is not so high as to substantially damage the substrate.

Finally, the conductive film 46 is divided into rear electrodes 461 and 462 by a third groove 463 formed in the conductive film 46 by laser scribing along and just above the second insulating strip 46 as illustrated in FIG. 3(F). The rear electrode 462 is isolated from the rear electrode 461 by the third groove. In this case, the presence of the second strip 45 is particularly important since the laser scribing need no longer reach to the surface of the photoelectric conversion layer 43. The laser scribing is preferably effected in order that the bottom of the third groove 463 is located at the midpoint of the thickness of the second strip 45. The third groove 463 preferably has a width of 10 to 40 $\mu$m. The wavelength of the laser light is selected to be no longer than 600 nanometers since many organic resins transmit light rays having wavelengths longer than 600 nanometers. As a result, a photoelectric conversion unit 401 comprising a front electrode 421, a photoelectric conversion region 431 and a rear electrode 461 provided on the photoelectric conversion region 431 is connected in series with an adjacent photoelectric conversion unit 403 comprising a front electrode 422, a photoelectric conversion region 432, and a rear electrode 462 provided on the photoelectric conversion region 432. Namely, the rear electrode 461 is electrically coupled to the front electrode 422 through the second groove 405.

Figure 4:
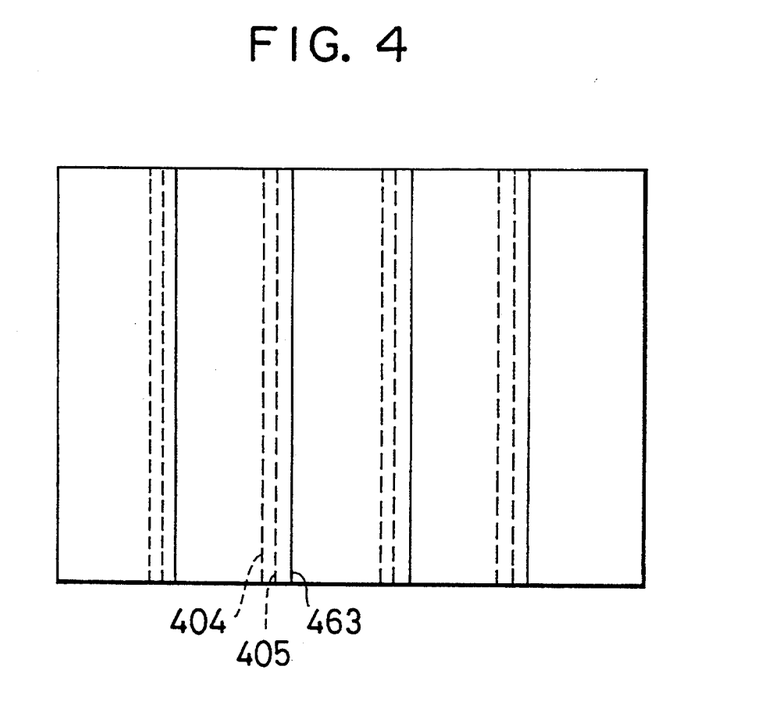
FIG. 4 is a schematic plan view showing the locations of grooves at the connection structure of a photovoltaic cell having a number of photoelectric conversion units in accordance with the present invention.

As a result, the method of manufacturing a solar cell is completed by performing laser scribing for 3 times and patterning only for a single time. Needless to say, only part of the whole structure of the solar cell is illustrated in the figures. In fact, a number of photoelectric conversion units are usually formed coupled to each other in series as the photoelectric conversion units 401 and 403 are. FIG. 4 illustrates such a typical structure with the first, second, third grooves 404, 405, and 407.

The foregoing description of preferred embodiments has been presented for purposes of illustration and description. It is not intended to be exhaustive or to limit the invention to the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method of forming a photovoltaic cell, comprising a step of sequentially forming a transparent first conductive film and a photoelectric conversion film on a transparent substrate, a step of forming a first groove and a second groove in order to divide said transparent first conductive film into a first transparent electrode and a second transparent electrode and in order to divide said photoelectric conversion film into a first photoelectric conversion region on said first transparent electrode and a second photoelectric conversion region on said second transparent electrode, a step of filling said first groove with a first insulator material and a second insulator located on said second photoelectric conversion region adjacent said second groove, a step of forming a second conductive film on said photoelectric conversion film over said first insulator and said second insulator in order to fill said second groove, and a step of laser scribing said second conductive film in order to form a third groove extending down to said second insulator and thereby dividing said second conductive film into first and second rear electrodes, whereby said first rear electrode is provided on said first photoelectric conversion region and is connected to said second transparent electrode through the filled second groove, and said second rear electrode is provided on said second photoelectric conversion region and is isolated from said first rear electrode by said third groove.

2. The method of claim 1, wherein said second conductive film substantially covers said photoelectric conversion film.

3. A method of forming a photovoltaic cell comprising:

forming a first conductive film on a substrate;
forming a photoelectric conversion layer on said first conductive film;
forming a first groove through said photoelectric conversion layer and said first conductive film in order to divide said first conductive film;
forming an opening through said photoelectric conversion layer and reaching to said first conductive film;
forming a first insulating strip to fill said first groove;
forming a second conductive film on said photoelectric conversion layer over said first insulating strip and making electrical contact with said first conductive film through said opening such that said second conductive film serially interconnects said first conductive film with another photovoltaic cell; and
forming a second groove through said second conductive film in order to electrically divide said second conductive film, said opening being located between said first groove and said second groove.

4. The method of claim 2, wherein said opening is formed as a third groove extending substantially in parallel to said first groove.

5. The method of claim 3, further comprising a step of forming a second insulating strip between said photoelectric conversion layer and said second conductive film and extending in parallel to said first groove, said second groove being formed along and just above said second insulating strip and reaching to said second insulating strip.

6. The method of claim 3, wherein said second conductive film substantially covers said photoelectric conversion film.

7. A method of forming a photovoltaic cell comprising:

forming a first conductive film on a substrate;
forming a photoelectric conversion layer on said first conductive film;
forming a first groove through said photoelectric conversion layer and said first conductive film in order to electrically divide said first conductive film and said photoelectric conversion layer;
forming a first insulating strip to fill said first groove;
forming a second insulating strip on said photoelectric conversion layer and extending substantially in parallel to said first groove;

forming an opening through said photoelectric conversion layer between said first groove and said insulating strip and reaching to said first conductive film;

forming a second conductive film on said photoelectric conversion layer over said insulating strip in electrical contact with said first conductive film through said opening such that said second conductive film serially interconnects said first conductive film with another photovoltaic cell; and forming a second groove through said second conductive film along and reaching to said insulating strip in order to electrically divide said second conductive film.

8. The method of claim 7, wherein said second conductive film substantially covers said photoelectric conversion film.

9. In a photovoltaic cell having a plurality of photoelectric conversion units connected in series on a substrate, each photoelectric conversion unit comprising a laminate of a first electrode, a photoelectric conversion layer, and a second electrode, wherein a first unit of said photoelectric conversion units is connected with a second unit of said photoelectric conversion units adjacent to said first unit through a connection structure having a first groove and a second groove formed in a laminate of said first electrode and said photoelectric conversion layer and a third groove formed through said second electrode, said first groove is filled with an insulator, said second groove is filled with a conductive material through which the first electrode of said second unit is connected to the second electrode of said first unit, the second electrode of said second unit is separated from the second electrode of said first unit by said third groove, and said third groove is located on an insulator formed on said photoelectric conversion layer.

10. The photovoltaic cell of claim 9, wherein said conductive material substantially covers said photoelectric conversion layer and extends over said insulators.

11. A photovoltaic cell comprising:
an insulating substrate;
a first conductive film formed on said substrate;
a photoelectric conversion layer formed on said first conductive film;
a first groove formed through said photoelectric conversion layer and said first conductive film in order to electrically divide said first conductive film;
a first insulating strip filling said first groove;
an opening formed through said photoelectric conversion layer and reaching to said first conductive film;
a second conductive film formed on said photoelectric conversion layer in electrical contact with said first conductive film through said opening to serially interconnect said first conductive film with another photovoltaic cell; and
a second groove formed through said second conductive film in order to electrically divide said second conductive film, said opening being located between said first groove and said second groove.

12. The photovoltaic cell of claim 11, wherein said opening is a third groove extending substantially, parallel to said first groove.

13. The photovoltaic cell of claim 11, further comprising a second insulating strip formed between said photoelectric conversion layer and said second conductive film and extending in parallel to said first groove, said second groove being formed along and just above to said second insulating strip and reaching to said second insulating strip.

14. The photovoltaic cell of claim 11, wherein said substrate is transparent.

15. The photovoltaic cell of claim 11, wherein said substrate is flexible.

16. The photovoltaic cell claim 11, wherein said substrate is made of a plastic film.

17. The photovoltaic cell of claim 16, wherein said substrate is made of polyethylene terephthalate.

18. The photovoltaic cell of claim 11, wherein said photoelectric conversion layer comprises amorphous semiconductor films forming a PIN junction.

19. The photovoltaic cell of claim 11, wherein said second conductive film substantially covers said photoelectric conversion layer and extends over said first insulating strip.

20. A photovoltaic cell comprising:
an insulating substrate;
a first conductive film formed on said substrate;
a photoelectric conversion layer formed on said first conductive film;
a first groove formed through said photoelectric conversion layer and said first conductive film in order to electrically divide said first conductive film and said photoelectric conversion layer;
an insulating strip formed on said photoelectric conversion layer and extending substantially in parallel to said first groove;
an opening formed through said photoelectric conversion layer between said first groove and said insulating strip and reaching to said first conductive film;
a second conductive film formed on said photoelectric conversion layer over said insulating strip in electrical contact with said first conductive film through said opening to serially interconnect said first conductive film with another photovoltaic cell; and
a second groove formed through said second conductive film along and reaching to said insulating strip in order to electrically divide said second conductive film.

21. The photovoltaic cell of claim 20, wherein said insulating strip is maple of an epoxy resin.

22. The photovoltaic cell of claim 20, wherein said substrate is transparent.

23. The photovoltaic cell of claim 20, wherein said substrate is flexible.

24. The photovoltaic cell of claim 20, wherein said substrate is made of a plastic film.

25. The photovoltaic cell of claim 24, wherein said substrate is made of polyethylene terephthalate.

26. The photovoltaic cell of claim 20, wherein said photoelectric conversion layer comprises amorphous semiconductor films forming a PIN junction.

* * * * *

UNITED STATES PATENT AND TRADEMARK OFFICE
CERTIFICATE OF CORRECTION

PATENT NO. : 5,348,589
DATED : September 20, 1994
INVENTOR(S) : Yasuyuki ARAI et al.

It is certified that error appears in the above-indentified patent and that said Letters Patent is hereby corrected as shown below:

In the drawings, Sheet 2, Fig. 2, the reference numerals "30" and "31" should be respectively changed to --21-- and --22--. In Sheet 4, Fig. 3(D), the reference numeral 421 should be applied to the left hand transparent electrode disposed on the substrate 41, the right hand transparent electrode 422 being already referenced in Fig. 3(D). Moreover, the reference numeral 431 should be applied to the photoelectric region disposed over the above-mentioned left hand transparent electrode 421. Furthermore, the reference numeral 432 should be applied to the photoelectric region disposed over the right hand transparent electrode electrode 422. In Sheet 4, Fig. 3(C), the reference numeral 421 should be applied to the left hand transparent electrode disposed on the substrate 41, and the reference numeral 422 applied to the right hand transparent electrode also disposed on the substrate 41. Moreover, the reference numeral 431 should be applied to the photoelectric region disposed over the above-mentioned left hand transparent electrode 421. Furthermore, the reference numeral 432 should be applied to the photoelectric region disposed over the right hand transparent electrode electrode 422. In Sheet 5, Fig. 3(E), the reference numerals "42" and "43" should be respectively changed to --421-- and --431--. Column 4, line 67, "file" should read as --film--. Column 7, line 11, "46" should read as --45--.

Signed and Sealed this

Thirtieth Day of November, 1999

Attest:

Q. TODD DICKINSON

Attesting Officer

Acting Commissioner of Patents and Trademarks